(12) United States Patent
Ostrowicki et al.

(10) Patent No.: US 12,119,280 B2
(45) Date of Patent: Oct. 15, 2024

(54) SEMICONDUCTOR DEVICE PACKAGE WITH REDUCED STRESS

(71) Applicant: Texas Instruments Incorporated, Dallas, TX (US)

(72) Inventors: Gregory Thomas Ostrowicki, Dallas, TX (US); Amit Sureshkumar Nangia, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/723,439

(22) Filed: Apr. 18, 2022

(65) Prior Publication Data

US 2022/0246489 A1 Aug. 4, 2022

Related U.S. Application Data (63) Continuation of application No. 16/826,047, filed on Mar. 20, 2020, now abandoned.

(51) Int. Cl.
  *H01L 23/49* (2006.01)
  *H01L 21/56* (2006.01)
  *H01L 23/00* (2006.01)
  *H01L 23/31* (2006.01)
  *H01L 23/498* (2006.01)

(52) U.S. Cl.
  CPC ........ *H01L 23/3135* (2013.01); *H01L 21/561* (2013.01); *H01L 23/3114* (2013.01); *H01L 23/49861* (2013.01); *H01L 24/45* (2013.01); *H01L 24/85* (2013.01); *H01L 24/97* (2013.01)

(58) Field of Classification Search
  CPC ............... H01L 23/3135; H01L 21/561; H01L 23/3114; H01L 23/49861; H01L 24/45; H01L 24/85; H01L 24/97
  USPC .................................. 257/773; 438/618, 666
  See application file for complete search history.

(56) References Cited

U.S. PATENT DOCUMENTS

| | | | | |
|---|---|---|---|---|
| 5,049,976 | A | * | 9/1991 | Demmin .................. H01L 24/32 257/782 |
| 2005/0245001 | A1 | | 11/2005 | Hyvonen et al. |
| 2008/0017966 | A1 | * | 1/2008 | Williams ................ H01L 24/13 257/E23.079 |
| 2010/0308468 | A1 | | 12/2010 | Yoshikawa et al. |
| 2011/0210408 | A1 | * | 9/2011 | Otsuki ............... G01C 19/5628 438/51 |
| 2011/0278742 | A1 | * | 11/2011 | Schelle .................... H01L 24/48 257/784 |
| 2012/0146218 | A1 | | 6/2012 | Zu et al. |
| 2014/0217613 | A1 | | 8/2014 | Undrea-Spenea et al. |
| 2015/0035130 | A1 | * | 2/2015 | How ..................... H01L 23/315 438/127 |

(Continued)

*Primary Examiner* — Didarul A Mazumder
(74) *Attorney, Agent, or Firm* — Dawn Jos; Frank D. Cimino (57) ABSTRACT

A described example includes: a semiconductor device die with an active surface; the semiconductor device die mounted on a package substrate with substrate leads and the semiconductor device die electrically coupled to the substrate leads; at least a first rigid low expansion material (RLEM) covering a portion of the semiconductor device die; and the first RLEM, the semiconductor device die, and a portion of the substrate leads covered with mold compound and forming a packaged semiconductor device die.

18 Claims, 13 Drawing Sheets

(56) References Cited

U.S. PATENT DOCUMENTS

| | | | |
|---|---|---|---|
| 2015/0123256 A1* | 5/2015 | Kierse | H01L 23/31 |
| | | | 257/678 |
| 2015/0280688 A1* | 10/2015 | Ortiz | H10N 30/88 |
| | | | 310/313 R |
| 2015/0364431 A1* | 12/2015 | Cheng | H01L 23/562 |
| | | | 438/123 |

* cited by examiner

SEMICONDUCTOR DEVICE PACKAGE WITH REDUCED STRESS

This application is a continuation of U.S. application Ser. No. 16/826,047, filed Mar. 20, 2020, the contents of which are herein incorporated by reference in its entirety.

TECHNICAL FIELD

This disclosure relates generally to semiconductor device packaging, and more particularly to a semiconductor device package with mold compound.

BACKGROUND

After manufacture by a semiconductor fabrication process on a semiconductor wafer to form semiconductor device dies, the semiconductor devices dies are separated from one another and packaged by attaching the individual dies to a substrate, and then encapsulating the dies and portions of the substrate in mold compound.

Figure 1A:
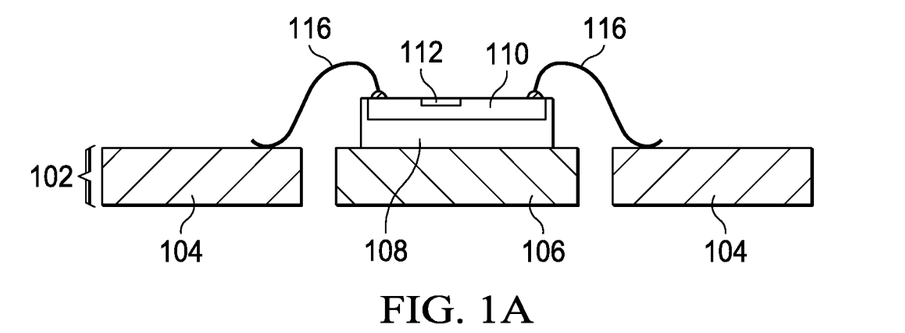
FIGS. 1A and 1B are cross sectional views of a semiconductor device die mounted on a lead frame and of the packaged semiconductor device die.

In FIG. 1A a semiconductor device die 108 is shown mounted on the die mount pad 106 of a lead frame 102. The semiconductor device die 108 is electrically coupled to leads 104 on the lead frame with wire bonds 116. The semiconductor device die 108 contains a component (or components) 112 including components with properties that change due to applied stress. The semiconductor device die will typically contain additional components that are less sensitive to applied stress.

Figure 1B:
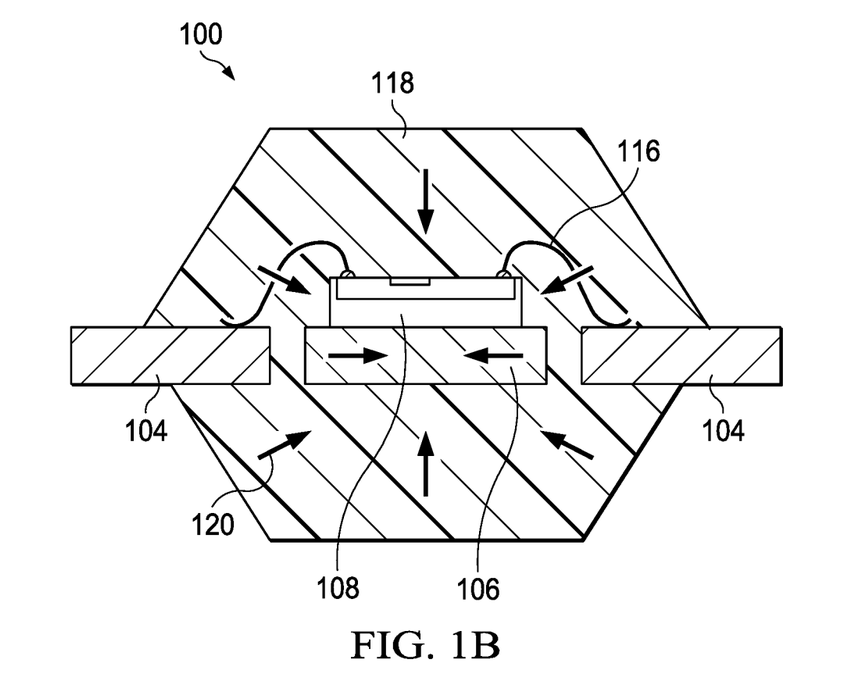

After packaging, performance of this stress sensitive component 112 can change with respect to the device specification window in response to mechanical stress from mold compound 118. In FIG. 1B the mold compound 118 applies compressive stress to the semiconductor device die 108 and to the stress sensitive component 112. For example, transistor properties sensitive to stress can cause transistors and subcircuits to become mismatched to the extent that the semiconductor device die 108 fails final test. The performance of transistors such as bipolar junction transistors (BJT), and analog transistors and the performance of semiconductor devices such as oscillators, piezoelectric devices, and bulk acoustic wave (BAW) oscillators are especially sensitive to stress from mold compound after packaging.

Mold compound can be a liquid at room temperature or can be a solid at room temperature. If a liquid at room temperature, the mold compound mixture is injected into a mold containing the substrate and a semiconductor device die. A chemical reaction then polymerizes the mold compound mixture causing it to heat up and to solidify as it cures. If a solid at room temperature, the mold compound can be heated to a molten state prior to injection into the mold. Example mold compounds 118 include epoxy, epoxy resin, polyimide, any potting or encapsulation material, and can be a thermoset epoxy resin. The mold compound 118 can be a polymer resin that contains filler particles that improve heat conduction, reduce shrinkage, and reduce cost.

After the mold compound 118 cools, the packaged semiconductor device 100 is removed from the mold. During curing and cooling the mold compound 118 shrinks. As the mold compound shrinks compressive stress is applied to the semiconductor device die 108. The compressive stress can degrade the performance of the semiconductor device 110 and decrease yield.

Filler particles used in mold compounds are often composed of hard materials with jagged irregular surfaces. As the mold compound 118 shrinks during curing and cooling, points on these filler particles can come into contact with the semiconductor device 110 and exert high point pressure and high point stress. Although beneficial for increasing thermal transfer and for other properties, these filler particles can exacerbate yield failure because of applied point stresses.

SUMMARY

A described example includes: a semiconductor device die with an active surface; the semiconductor device die mounted on a package substrate with substrate leads and the semiconductor device die electrically coupled to the substrate leads; at least a first rigid low expansion material (RLEM) covering a portion of the semiconductor device die; and the first RLEM, the semiconductor device die, and a portion of the substrate leads covered with mold compound and forming a packaged semiconductor device die.

DETAILED DESCRIPTION

Corresponding numerals and symbols in the different figures generally refer to corresponding parts unless otherwise indicated. The figures are not necessarily drawn to scale.

Elements may be described as "encapsulated" herein. When a semiconductor device is packaged with mold compound, the packaged semiconductor device is referred to as "encapsulated" and the process for molding may be referred to as "encapsulation." As used herein, when a semiconductor device die mounted on a substrate is described as encapsulated, portions of leads on the substrate remain uncovered by the mold compound to form package leads or terminals. The package leads or terminals allow both electrical connection and mechanical attachment of the packaged semiconductor device to a surface of a board in a system, such as a circuit board. Even though portions of the leads remain uncovered by mold compound the packaged semiconductor device is described as "encapsulated" or it is described as being formed by "encapsulation." For example, the exposed portion of the substrate leads may later be surface mounted to a printed circuit board in a piece of electronic equipment.

The term "low expansion material" (LEM) is used herein, and as used herein means a material with a CTE less than the CTE of silicon. The term "rigid low expansion material" (RLEM) describes a rigid material with a coefficient of thermal expansion (CTE) less than the CTE of silicon (less than 2.6 ppm/° C.). The CTE of the RLEM can also be negative. Material with a negative CTE expands as it cools. Material with a positive CTE shrinks as it cools. Example RLEM materials are glass and ceramic materials.

The term "rigid" as used herein means that when a force is applied to the RLEM it deforms less than fully cured room temperature mold compound. In the arrangements it is preferred that the RLEM deforms less than half the amount that fully cured room temperature mold compound deforms in response to an applied stress.

The term "conductive post connect" is used herein. As used herein, a conductive post connect is a structure made of a conductive material, for example copper, and provides a connection between bond pads on a die and a package substrate. A package substrate, such as a lead frame, will have a conductive portion arranged to electrically and mechanically connect to the conductive post connect. The conductive post connect can have a variety of shapes, and can extend along the same direction as the conductive lead, so that it appears as a rail or rectangle. Solder will be formed at the end of the conductive post connect. A copper pillar bump is an example of a conductive post connect, the conductive post connect can also be a column, rectangle or rail shape, and can have an oval, round, or rectangular cross section. In examples, the conductive post connects are circular or oval in cross section, and have diameters from 74-400 microns, and extend away from the bond pads of the semiconductor device about 35-100 microns. In examples, the conductive post connects can be arranged in parallel with additional conductive post connects to provide a low resistance path between the die and the package. The conductive post connects can also transfer thermal energy away from the die to a package lead and then out of the package.

The term "stress sensitive component" is used herein. As used herein, a stress sensitive component is a component that is part of a semiconductor device die where the performance of the component can change due to mechanical stress, such as mold compound stress. Examples include a bipolar junction transistor (BJT), an analog transistor, an oscillator, a bulk acoustic wave (BAW) oscillator, a piezo-electric device, a junction field effect transistor (JFET), a metal oxide semiconductor field effect transistor (MOSFET), a thin film resistor, and a vertical capacitor.

In the arrangements, the problem of mechanical stress due to mold compound affecting the performance of stress sensitive components on a semiconductor device die is solved by placing an RLEM material over the stress sensitive components prior to packaging the semiconductor device die with mold compound. The RLEM prevents the mold compound stress from affecting the stress sensitive components, thereby improving electrical performance of the packaged devices.

Figure 2A:
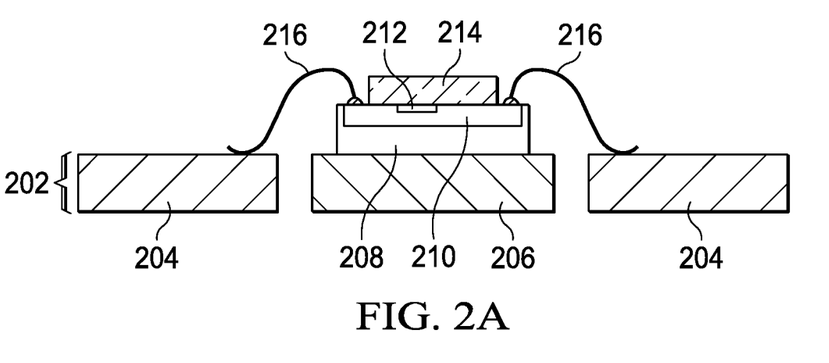
FIGS. 2A and 2B are cross sectional views of a semiconductor device die and with a rigid low expansion material (RLEM) mounted on a lead frame and the packaged semiconductor device die and RLEM.

FIGS. 2A and 2B are cross sectional views of a semiconductor device die 208 with a RLEM 214 attached to the device side 210 of the semiconductor device die. The semiconductor device die 210 is mounted on a die mount pad 206 of a package substrate 202. In FIG. 2A, similar reference labels are used for similar elements shown in FIG. 1A, for clarity. For example, die 208 in FIG. 2A corresponds to die 108 in FIG. 1A. Electrical properties of a component or components 212 on the semiconductor device 210 are sensitive to stress. RLEM 214 covers the stress sensitive component or components 212. The semiconductor device die 208 is electrically coupled to leads 204 on the package substrate 202 with wire bonds 216.

Figure 2B:
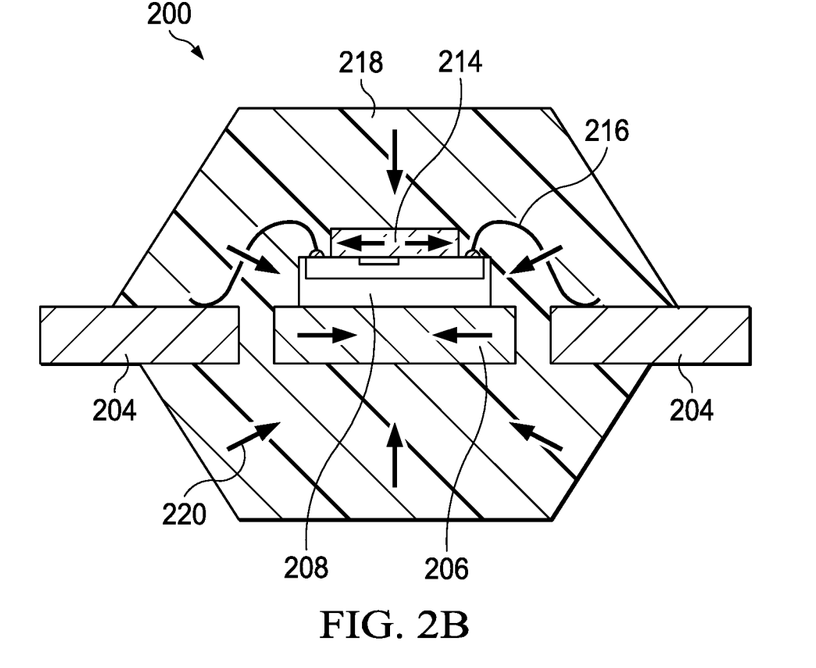

FIG. 2B shows the RLEM 214, the semiconductor device die 208, the wire bonds 216, the die attach pad 206, and the lead frame leads 204, after encapsulation with mold compound 218. During encapsulation, the temperature of the semiconductor device package 200 rises to approximately 175° C. At this temperature the mold compound 218 and adhesive between the die 208 and the lead frame 202 can flow so stress between the various materials in the package 200 is approximately zero. As the package 200 cools, the different materials contract by different amounts, causing stresses to build up in the package. These stresses are locked into the package when it reaches room temperature. The metal die attach pad 206 shrinks by about 19 ppm/° C. and the mold compound shrinks by about 30 ppm/° C., while the semiconductor device die 208 shrinks by about 2.6 ppm/° C. The RLEM 214 that covers the stress sensitive component 212 is rigid and shrinks by less than 2.6 ppm/° C. At room temperature, the mold compound 218 applies compressive stress to the RLEM 214. The RLEM 214 with a coefficient of thermal expansion (CTE) of less than 2.6 ppm/° C. blocks stress due to the mold compound 218 from being transmitted to the stress sensitive component 212. Since the RLEM 214 shrinks less than the semiconductor device die 208, the RLEM 214 may apply a slight tensile stress. Useful RLEM materials can have a CTE of between ~−30 and ~2 ppm//° C.

In contrast to the example of FIG. 2B, in the example of FIG. 1B, the RLEM of FIG. 2B is not present. In this example both the die attach pad 106 and the mold compound 118 shrink more than the semiconductor device die 108 as the package cools, so that compressive stress is applied to the semiconductor device die 108 and to the stress sensitive component 112 when the packaged semiconductor device 100 is at room temperature.

Figure 3A:
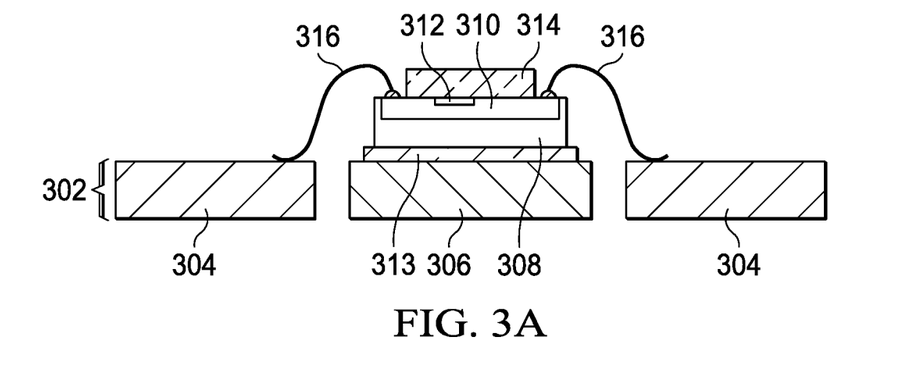
FIGS. 3A and 3B are cross sectional views of a semiconductor device die with rigid low expansion material (RLEM) on both sides of the die mounted on a lead frame and the packaged semiconductor device die and RLEMs.
Figure 3B:
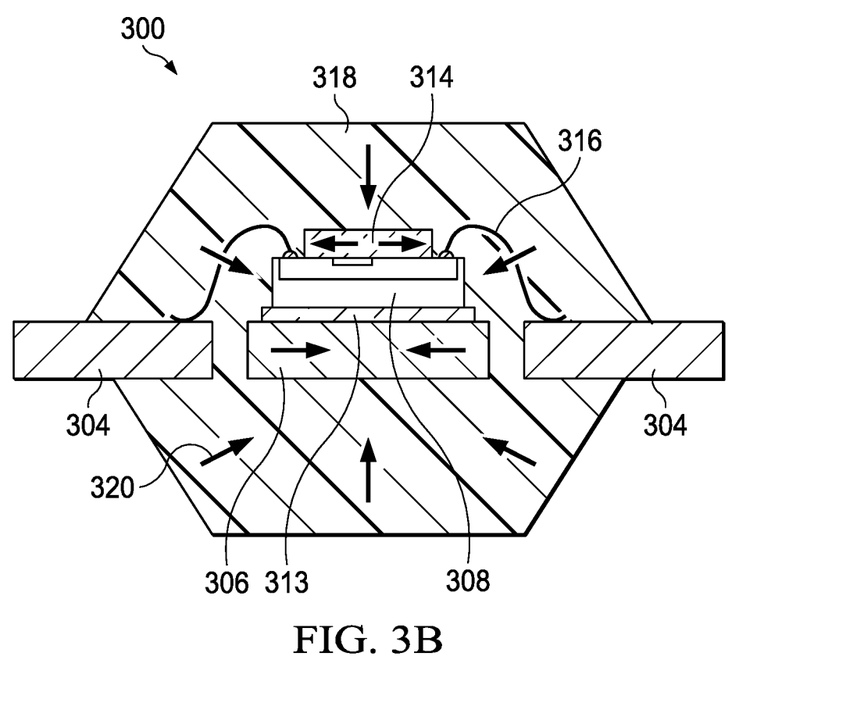

In FIGS. 3A and 3B, a second RLEM 313 is attached to the non-device side of the semiconductor device die 308 before the semiconductor device die 308 is mounted on the die attach pad 306. In FIG. 3A, similar reference labels are used for similar elements shown in FIG. 1A, for clarity. For example, die 308 in FIG. 3A corresponds to die 108 in FIG. 1A. The semiconductor device die 308 with the first RLEM 314 and the second RLEM 313 is mounted on a die attach pad 306 of the substrate 302. The semiconductor device die 308 is electrically connected to leads 304 of the substrate 302 with wire bonds 316.

The first RLEM 314 on the device side of the semiconductor device die 308 (die 308 has a CTE ~2.6 ppm/° C.) shields the stress sensitive component 312 from mold compound 318 stress (~30 ppm/° C.). The second RLEM 313 on the non-device side of the semiconductor device die 308 shields the semiconductor device die 308 (2.6 ppm/° C.) from die mount pad 306 stress (19 ppm/° C.).

Figure 4:
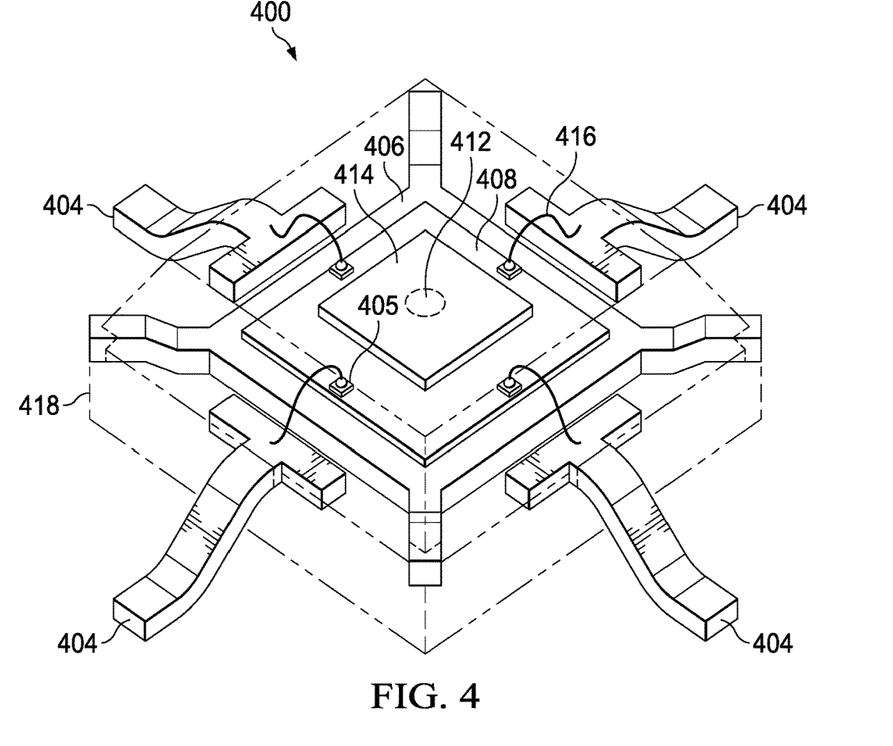
FIG. 4 is a projection view of a packaged semiconductor device with rigid low expansion material (RLEM) covering a portion of the surface.

FIG. 4 is a projection view of an example packaged semiconductor device 400 with a RLEM 414 covering a stress sensitive component 412 on the device side of the semiconductor device die 408. In FIG. 4, similar reference labels are used for similar elements shown in FIG. 1A, for clarity. For example, die 408 in FIG. 4 corresponds to die 108 in FIG. 1A. The semiconductor device die 408 is mounted on a die attach pad 406 of a substrate. Bondpads 405 on the semiconductor device die 408 are electrically connected to leads 404 on the package substrate with wire bonds 416. The semiconductor device die 408, the RLEM 414, the wire bonds 416, and a portion of the leads 404 are encapsulated with mold compound 418. Portions of the substrate leads 404 protruding from the mold compound 418 are not covered by the mold compound 418. The exposed portion of the substrate leads 404 form terminals for the packaged device that allow both electrical connection and mechanical attachment of the package 400 to leads on the circuit substrate. For example, the exposed portions of leads 404 may later be surface mounted to a system circuit board (not shown). The example of FIG. 4 is a "leaded" package. Leaded package types include single inline packages (SIPP) and dual inline packages (DIP). Small outline integrated circuit (SOIC) packages are also leaded packages.

In this example the package substrate is a lead frame. In the arrangements, useful package substrates can include: lead frames of copper or other conductive metals (such as Alloy 42 or stainless steel); molded interconnect substrates; pre-molded lead frames (PMLFs) with lead frame conductors and mold compound in a preformed structure; tape based and film based substrates carrying conductors; ceramic substrates, laminate substrates with multiple layers of conductors and insulator layers; and printed circuit board substrates of ceramic, fiberglass or resin, or glass reinforced epoxy substrates such as FR4. Useful packaging types include wire bonded and flip chip packages. In wire bonded packages such as the example in FIG. 4 the semiconductor device die 408 is mounted on a die attach pad 406 on the substrate. Wire bonds 416 couple bond pads on the semiconductor device die 408 to leads 404 on the substrate. The semiconductor device die 408 may be oriented with an active surface facing away from the package substrate or oriented "face up" in a cross section with the package terminals 404 oriented at the bottom of the view. In an alternative flip chip package such as the example in FIG. 8D, the semiconductor device die 808 is coupled to conductive leads 804 on a package substrate using conductive post connects 815 (solder capped 842 conductive posts 840, FIG. 8B) that are formed on the active surface of the semiconductor device die 808. The semiconductor device die is mounted on a substrate 802 by forming solder joints 843 between the conductive post 840 and the substrate leads 804. The semiconductor device die 808 active surface is oriented facing the package substrate 802, or "face down" in a cross section oriented with the package terminals 804 at the bottom of the view, which is why the package 800 is referred to as a "flip chip" package. A flip-chip package can also be formed using solder balls that are formed on bond pads on the semiconductor device die 808 instead of on conductive posts 840. Wire bonded and flip chip packages are useful with the arrangements.

Figure 5:
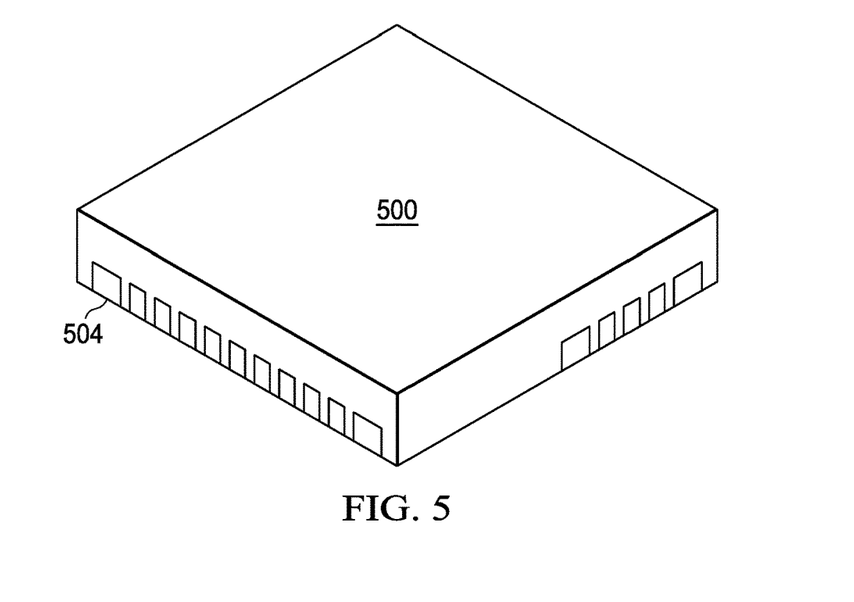
FIG. 5 a projection view of a quad., flat, no lead (QFN) packaged semiconductor device.

FIG. 5 illustrates an example quad. flat no lead (QFN) package 500. Substrate leads 504 are exposed on the surface of the QFN 500 and are flush with the exterior surface of the body of QFN 500. The substrate leads 504 can be on one, two or more sides of the finished semiconductor device package 500 to form single, dual or quad type packages. No-lead packages 500 are sometimes referred to as "flat" when the exterior surface of the finished package used for mounting to a system board is a flat surface. Another useful no-lead package is a small outline no-lead (SON) package which may have terminals on two sides.

Figure 6A:
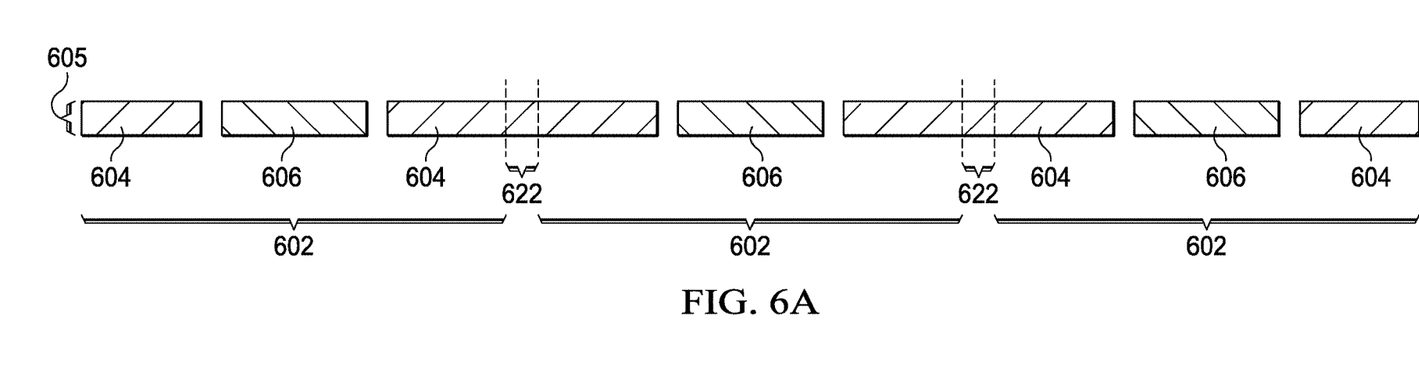
FIGS. 6A-6H illustrate in a series of cross section steps of an example method for blocking mold compound stress from a stress sensitive component in a semiconductor device package.
Figure 6B:
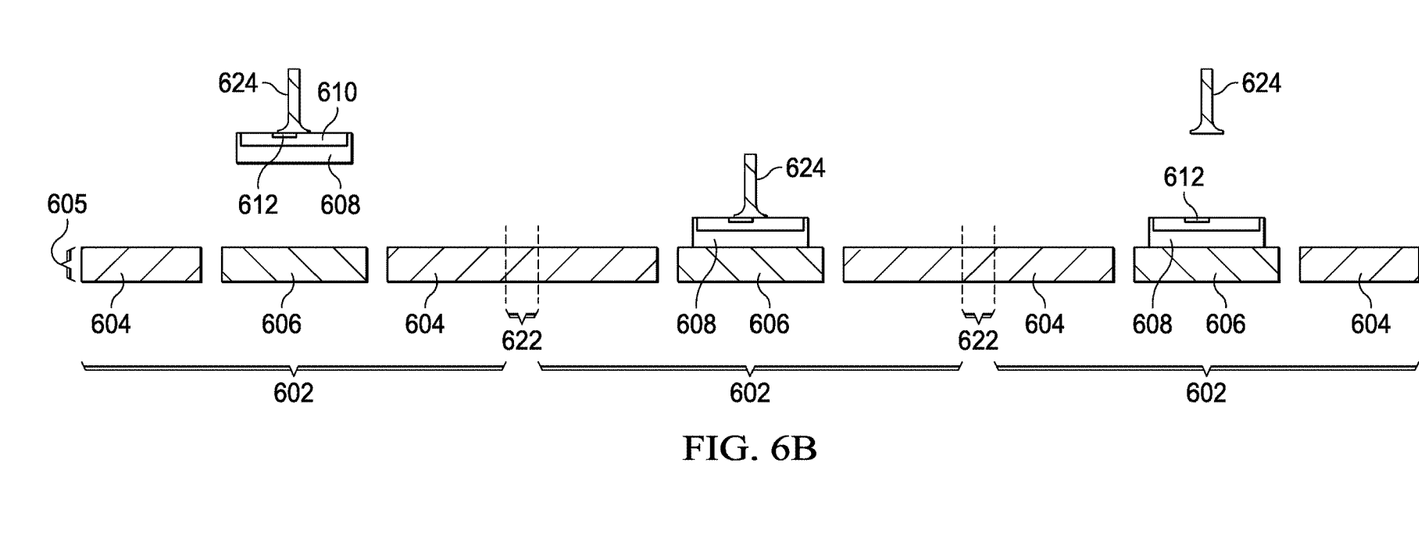
Figure 6C:
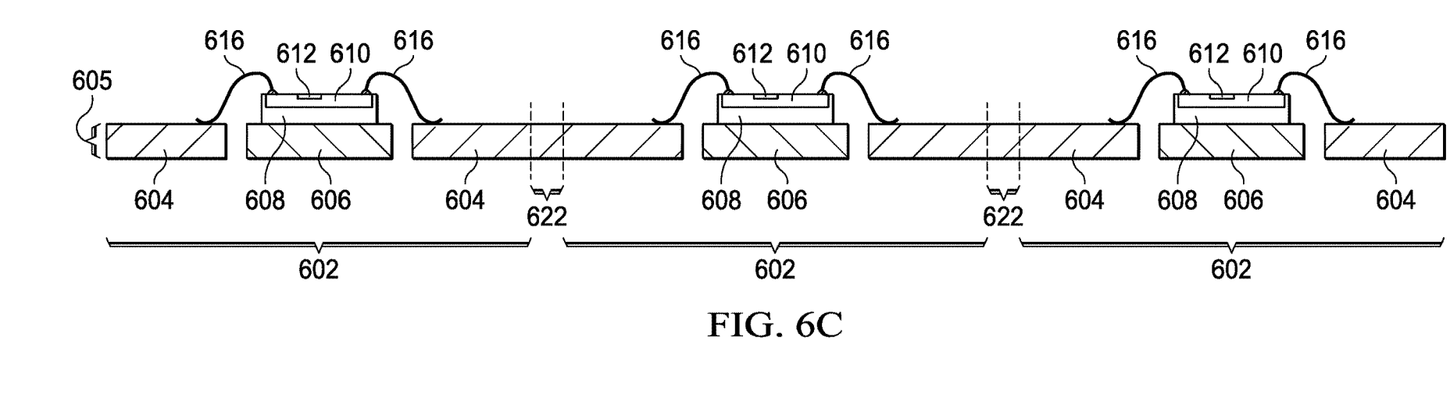
Figure 6D:
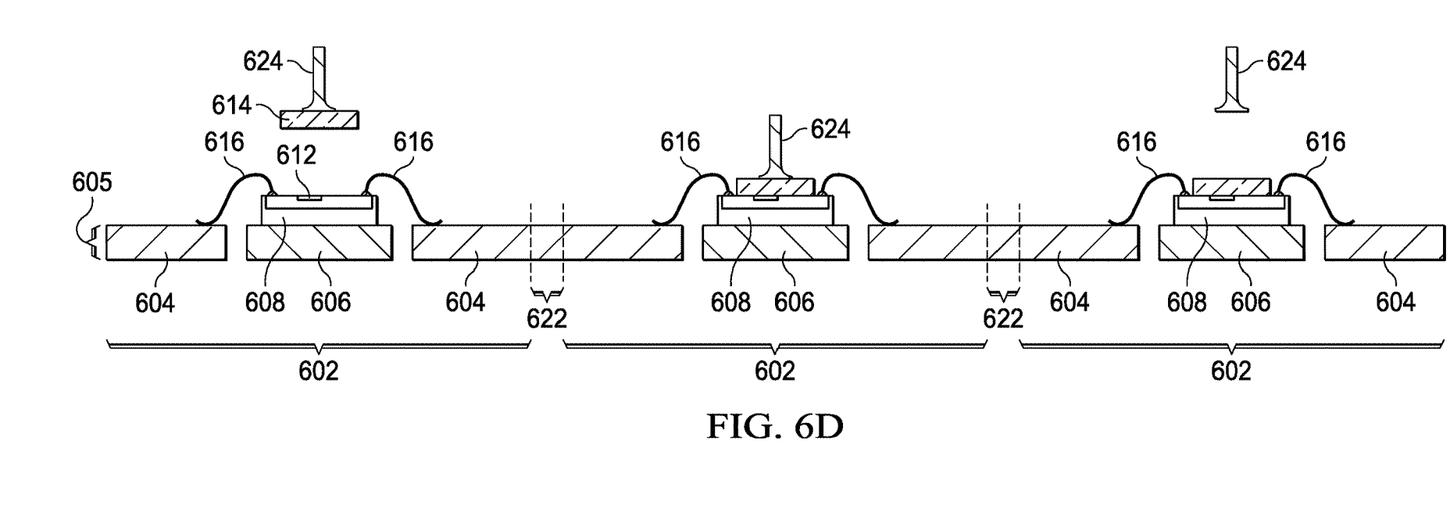
Figure 6E:
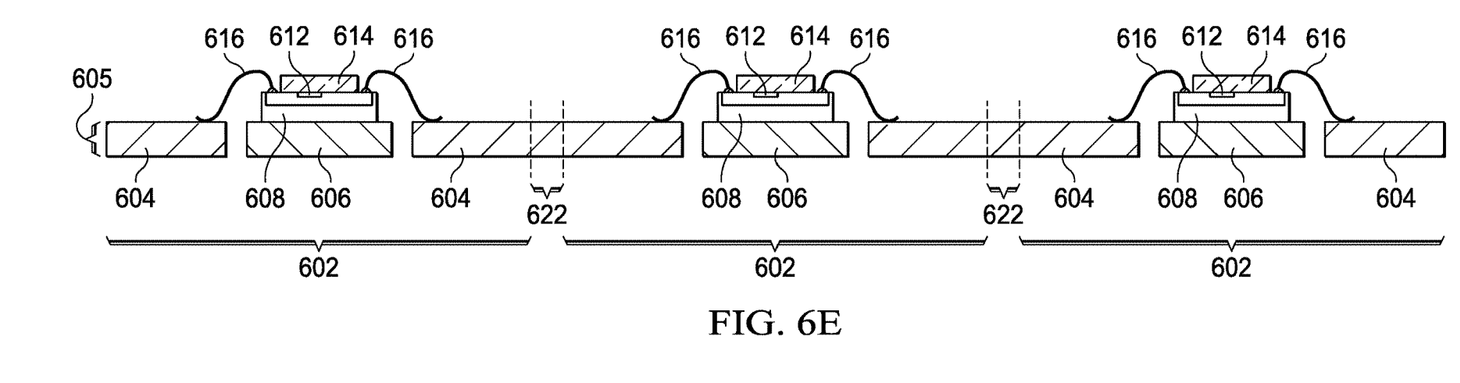
Figure 6F:
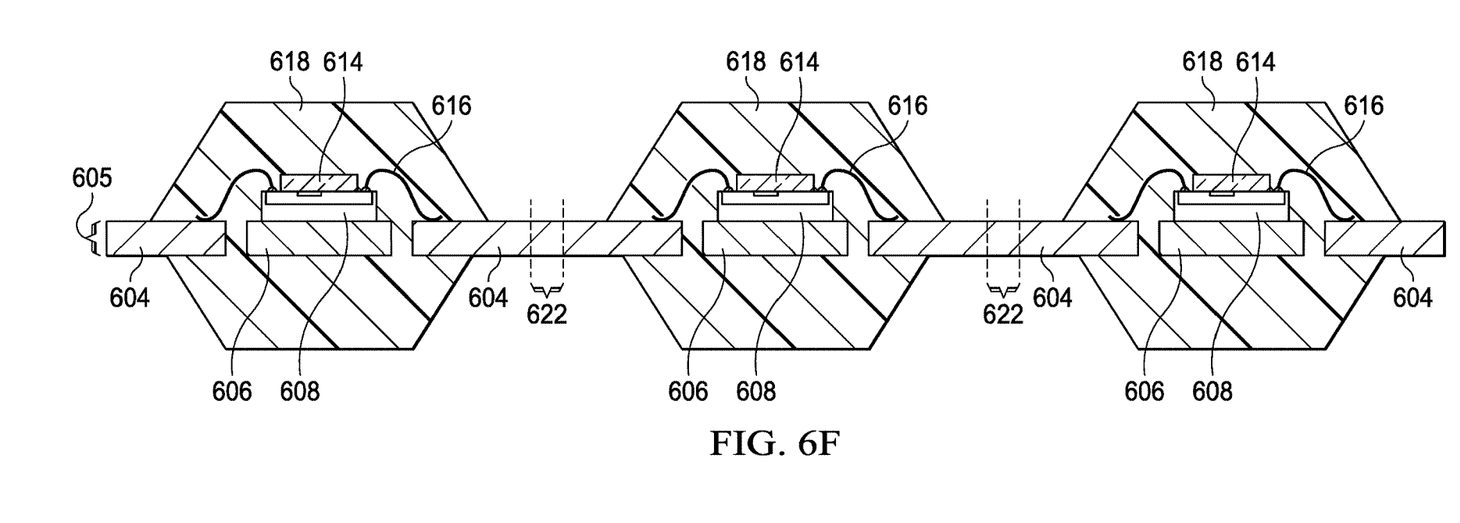
Figure 6G:
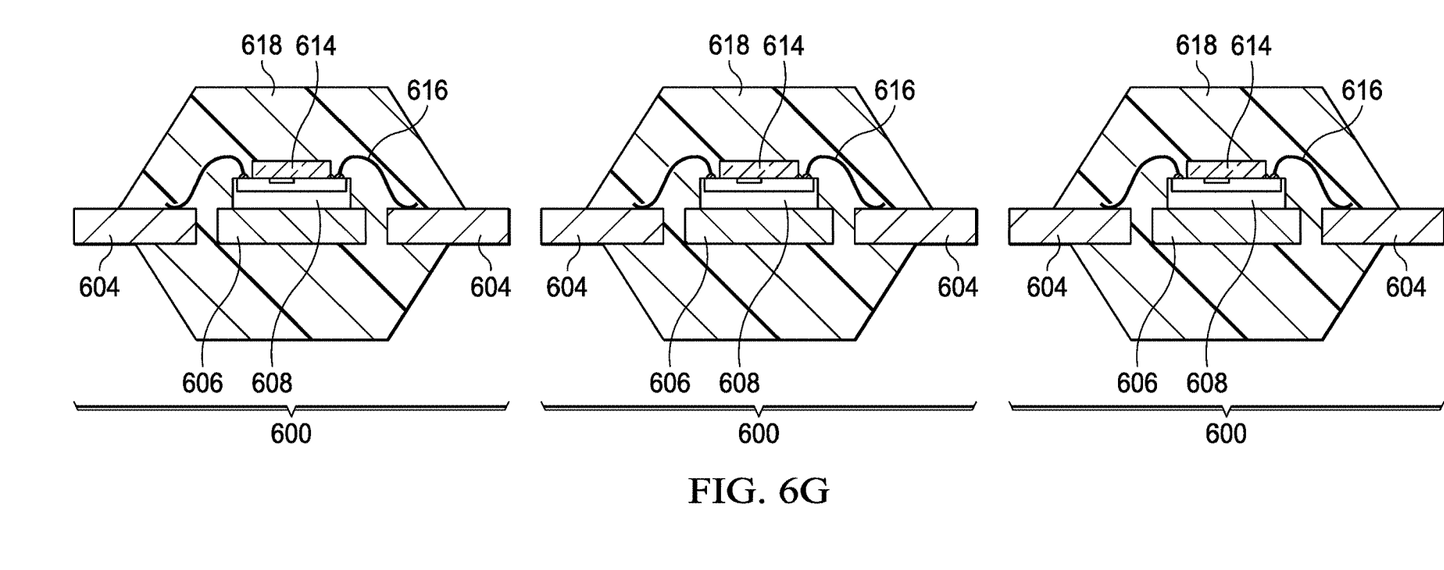
Figure 6H:
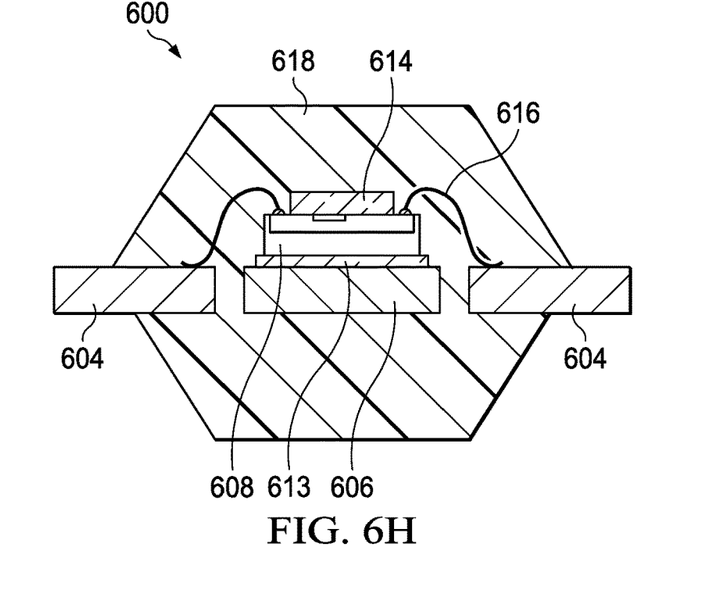
Figure 7:
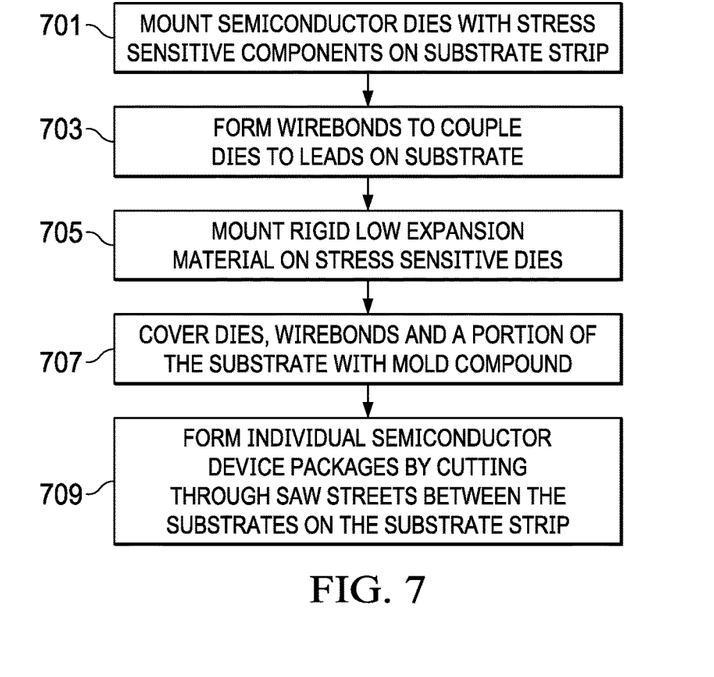
FIG. 7 is a flow diagram describing the steps in FIGS. 6A through 6H.

FIGS. 6A-6H are a series of cross sectional views and with the flow diagram in FIG. 7 illustrate certain steps of a method for forming a packaged integrated circuit die with rigid low expansion material (RLEM) protecting a stress sensitive component. In FIGS. 6A-6H, similar reference labels are used for similar elements shown in FIG. 1A for clarity. For example, dies 608 in FIGS. 6B-6H correspond to die 108 in FIG. 1A.

FIG. 6A shows a cross sectional view of a substrate strip 605 with three individual substrates 602 joined together by saw streets 622 made of substrate material. In the example substrate strip 605, each substrate 602 has a die attach pad 606 and substrate leads 604. Substrate leads 604 from two adjacent substrates 602 are joined together by a saw street 622 to form the substrate strip 605.

In FIG. 6B, a pick and place tool 624 picks up semiconductor device dies 608 and mounts them on the die attach pads 608 of the lead frame strip 605 (step 701, FIG. 7). The active surface 610 of semiconductor device dies 608 face away from the die attach pads 606. A stress sensitive component (or components) 612 is on the active surface 610.

FIG. 6C shows the lead frame strip 605 with a semiconductor device die 608 mounted on the die attach pads 606 of each substrate 602. Wire bonds 616 are formed (step 703) to electrically connect the semiconductor device 610 to leads 604 on the lead frame strip 605.

FIG. 6D (step 705) shows the pick and place tool 624 picking up the RLEMs 614 and attaching them to the active surface 610 of the semiconductor device die 608 and covering the stress sensitive component 612. The RLEMs 614 block mold compound stress from being transmitted to the stress sensitive components 612 and blocks filler particles from causing point induced stresses. In an example the RLEMs 614 are a rigid material with a coefficient of thermal expansion (CTE) that is less than the CTE of silicon (<2.6 ppm/° C.). Useful RLEM materials include sitall which is a crystalline glass—ceramic (CTE~0.15 ppm/° C.), invar (64FeNi; CTE~1.5 ppm/° C.), quartz (CTE~0.77-1.4 ppm/° C.), diamond (CTE ~1.18 ppm/° C.), graphite (CTE~2-3 ppm/° C.), zirconium tungstate ($ZrW_2O_x$; CTE ~−26.4 ppm/° C.), and Corning ULE 7972 and ULE 7973 (CTE~0 ppm/° C.). The RLEM should cover the sensitive stress device 612 and should overlap it 612 by at least 10 μm per side. The required thickness of the RLEM 614 can be determined by trial and error or by modeling or simulation. The RLEM 614 must be sufficiently thick to prevent stress from the mold compound 618 from negatively impacting yield. It is preferred the RLEM 614 be as thick as possible within the constraints of the package 600. For example, the specification for the minimum mold compound 618 thickness covering the RLEM 614 must be met. For circuits that are ultrasensitive to stress, the injection mold tool could be made larger to accommodate a thicker RLEM 614. The RLEM 614 should not violate any of the design rules that require portions of the surface of the semiconductor device die 608 remain open, such as areas around bond pads or areas around microprobe pads.

FIG. 6E shows the substrate strip 605 with semiconductor device dies 608 mounted on each die attach pad 606 and with an RLEM 614 covering on each stress sensitive component 612.

In FIG. 6F (step 707) the semiconductor device dies 608, the RLEMs 614, the wire bonds 616, the die attach pads 606, and a portion of the substrate leads 604 are encapsulated with mold compound 618. The RLEMs 614 protect the stress sensitive components 612 from the mold compound 618 stress and from mold compound filler particle point stress.

In FIG. 6G (step 709) individual packaged semiconductor devices 600 are formed by cutting through the saw streets 622 that join the individual substrates 602 together in the substrate strip 605.

If desired, prior to step 701, a second RLEM (613, FIG. 6H) can be mounted on the non-device side of the semiconductor device die 608 before it is mounted on the substrate strip 605. This second RLEM additionally protects the semiconductor device die 608 from stress applied by the die mount pad 606.

Figure 8A:
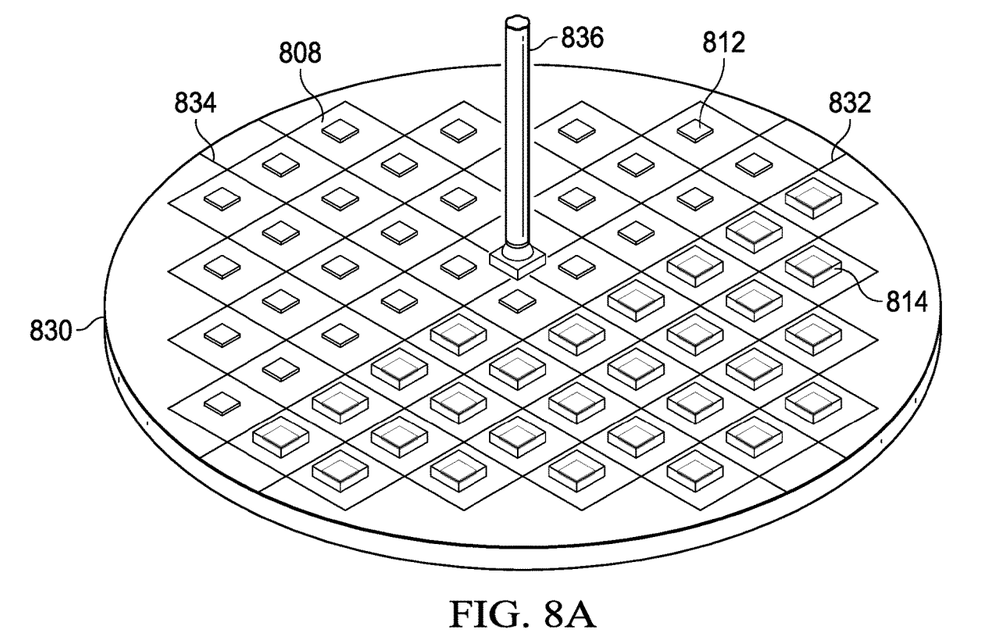
FIGS. 8A-8F are a projection view and cross-sectional views of a second example method for blocking mold compound stress from a stress sensitive component in a semiconductor device package.
Figure 8B:
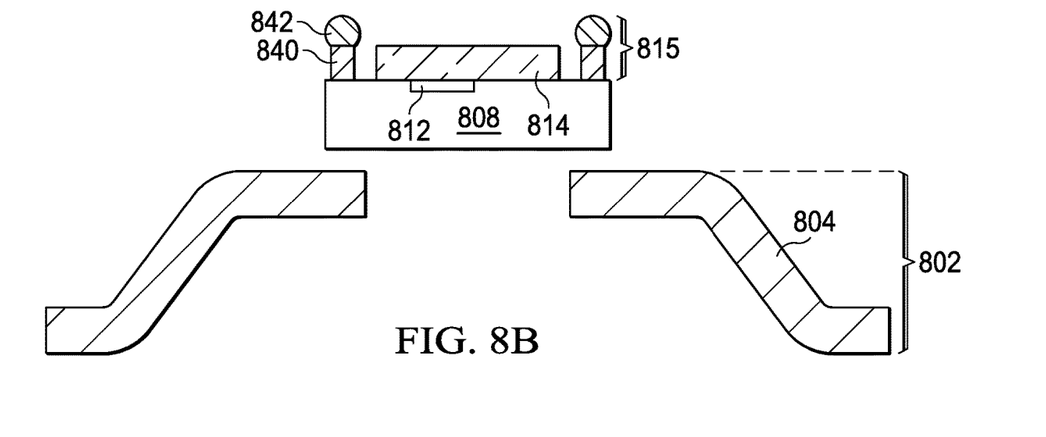
Figure 8C:
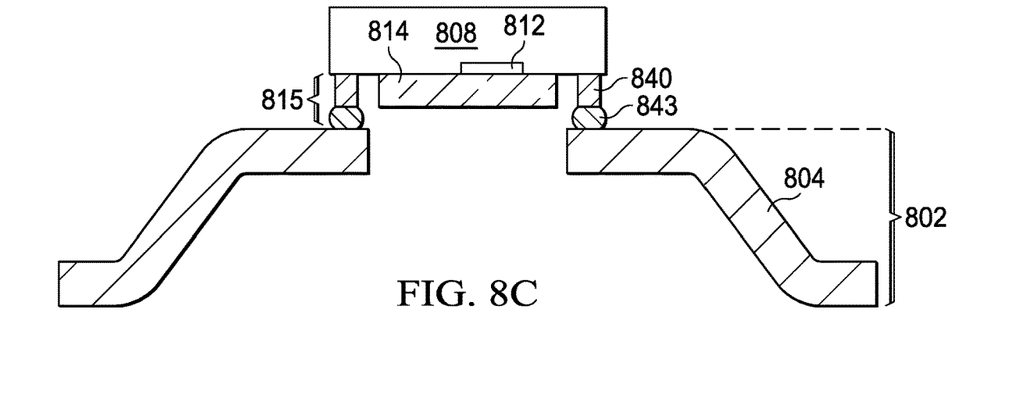
Figures 8D, 8E:
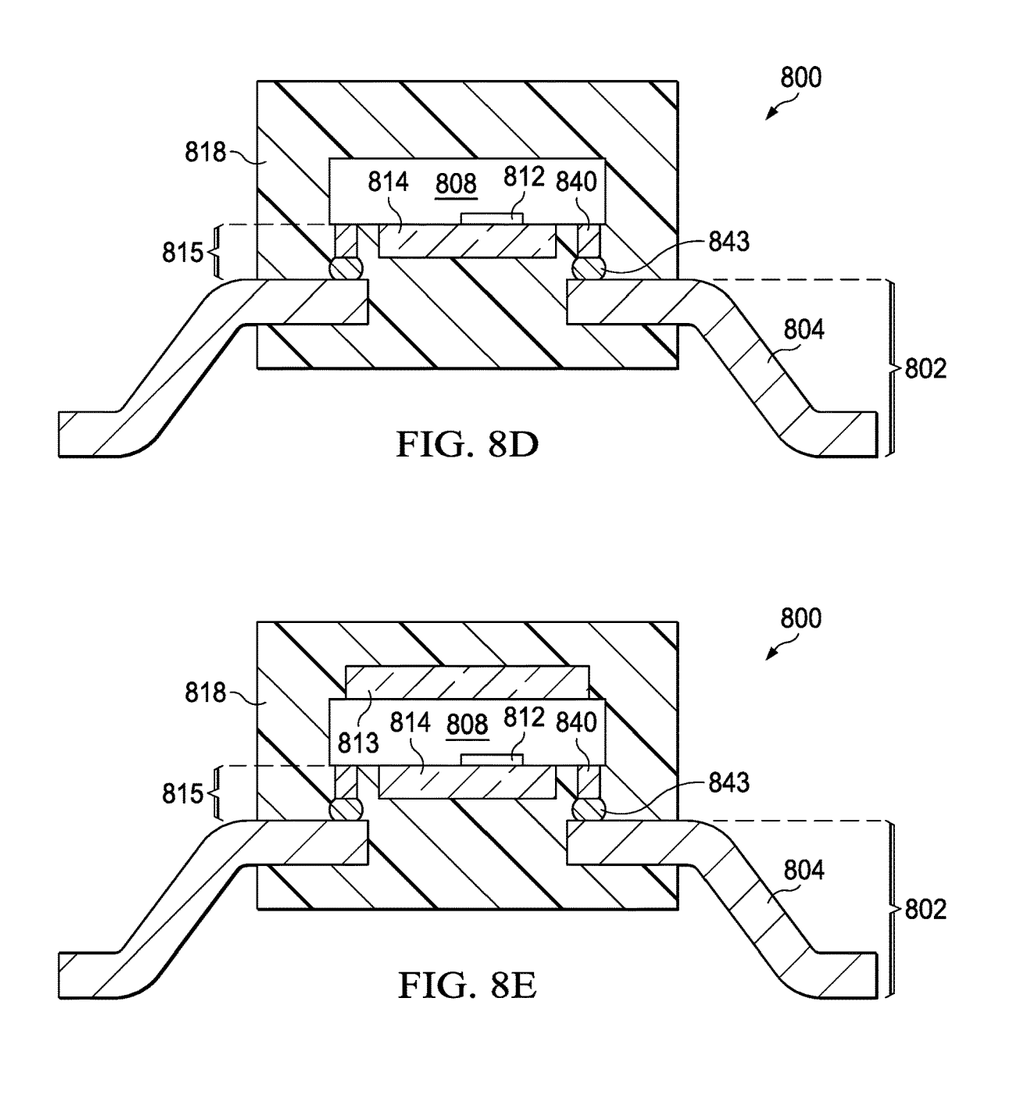
Figure 9:
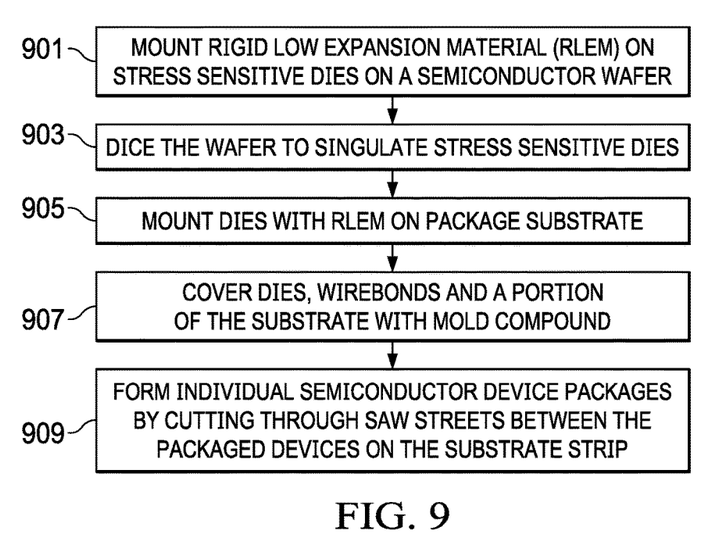
FIG. 9 is a flow diagram describing the steps shown in FIGS. 8A-8D.

FIGS. 8A-8E, and flow diagram FIG. 9 illustrate the major manufacturing steps in a method for manufacturing a packaged semiconductor device 800 with a RLEM 814. In FIGS. 8A-8E, similar reference labels are used for similar elements shown in FIG. 1A for clarity. For example, dies 808 in FIGS. 8A-8E correspond to die 108 in FIG. 1A. In this arrangement the RLEMs are attached to the dies 808 on the semiconductor wafer 830 prior to dicing and packaging. These dies 808 could be packaged in wire bond packages 600 as described in FIGS. 6A-6H. In this example the dies 808 are packaged in a flip-chip package.

Wafer 830 in FIG. 8A is a fully processed and tested semiconductor device wafer 830 with semiconductor device dies 808 formed across the device surface of the wafer 830. Horizontal (832) and vertical (834) scribe streets (or scribe lanes) separate adjacent dies 808. A stress sensitive component (or components) 812 is on the device side surface of each semiconductor device die 808 on the semiconductor device wafer 830.

In FIG. 8A, step 901 in FIG. 9, a pick and place tool 836 picks up a RLEM 814 and places it on the device side of each semiconductor device die 808. The RLEM 814 covers the stress sensitive component 812. Only die 808 that have passed final wafer test need an RLEM 814. After dicing, dies 808 that failed final test are discarded.

After the RLEMs 814 are attached, the semiconductor wafer 830 is diced (step 903). In FIG. 8B is a diced (or singulated) die 808 and also a package substrate 802 with substrate leads 804. A RLEM 814 covers the stress sensitive component 812. A conductive post connect 815 on the device side of the semiconductor device die 808 is composed of a solder ball or solder cap 842 covering the end of a copper post 840 distal to the device side surface.

In FIG. 8C, the semiconductor die 808 is flipped over so that the device side of the semiconductor device die 808 faces the package substrate 802. The conductive post connects 815 are aligned to substrate leads 804 on the substrate 802. The semiconductor device die 808 is mounted on the substrate 802 by melting the solder balls 842 in a thermal reflow process to form solder bonds 843 between the conductive post connect 815 and the substrate leads 804.

In FIG. 8D, the RLEM 814, the semiconductor die 808, the conductive post connects 815, and a portion of the substrate leads 804 are encapsulated with mold compound 818 to form a packaged semiconductor device 800 with an RLEM 814.

In the example in FIG. 8E, a second RLEM 813 is attached to the non-device side of the semiconductor device die 808 to additionally block package stress from reaching the semiconductor device die 808. This is an optional step.

Figure 8F:
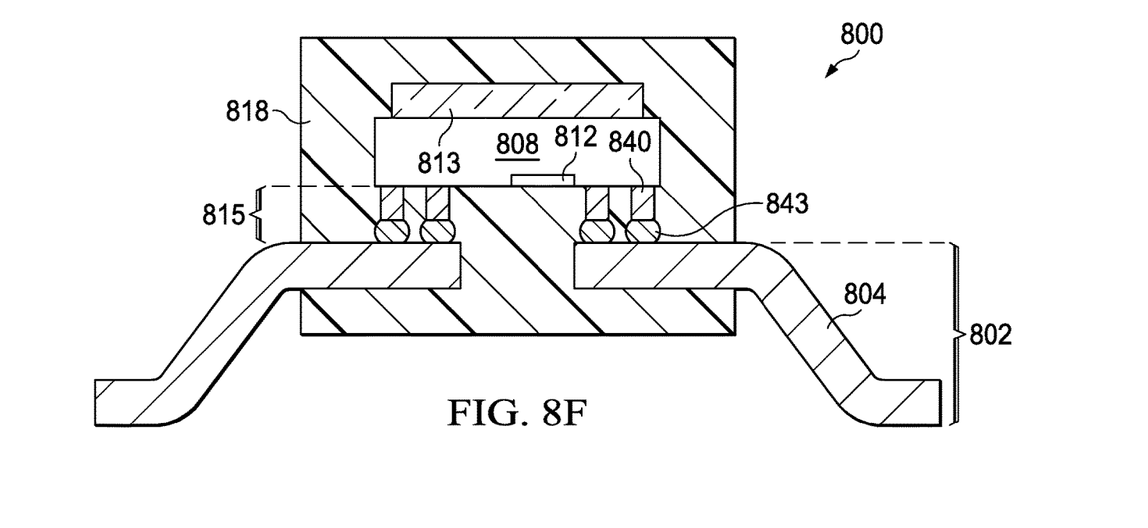

In another example shown in FIG. 8F, because of area constraints on the device side of the semiconductor device die 808 (such as can be encountered with ball grid arrays) an RLEM 813 is attached to the non-device side of the semiconductor device die 808, but an RLEM is not attached to the device side.

Figure 10A:
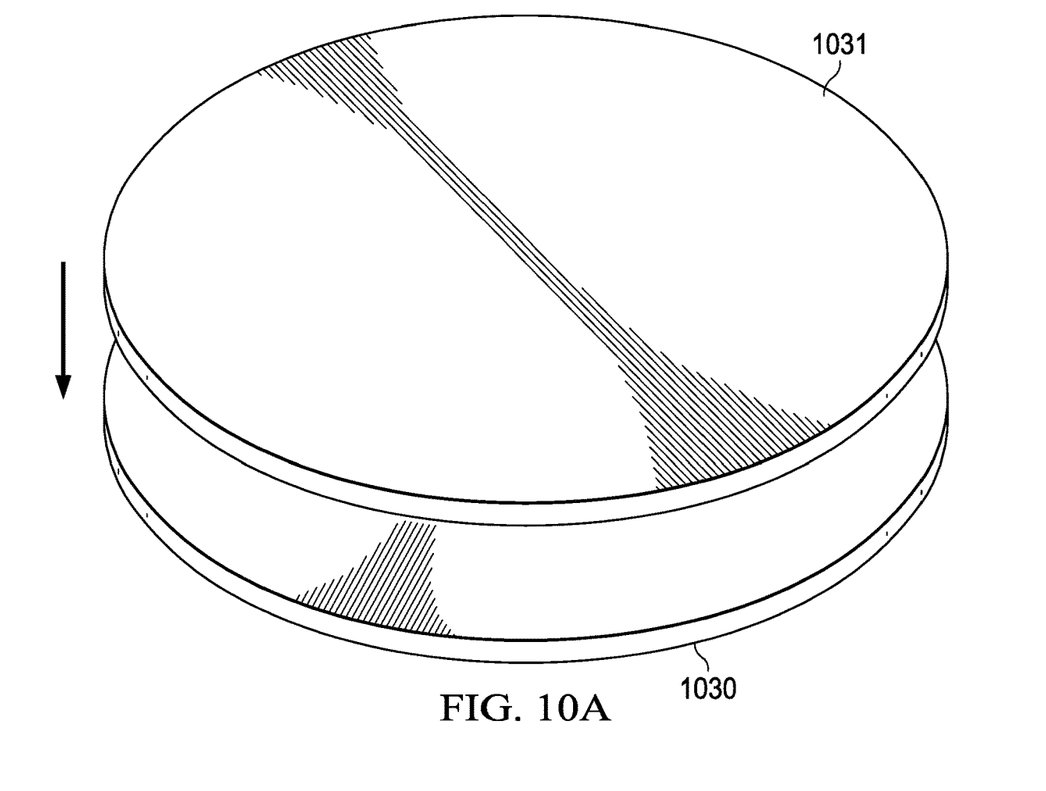
FIGS. 10A-10C illustrate in a series of steps a wafer level process for applying RLEM elements to a wafer.
Figure 10B:
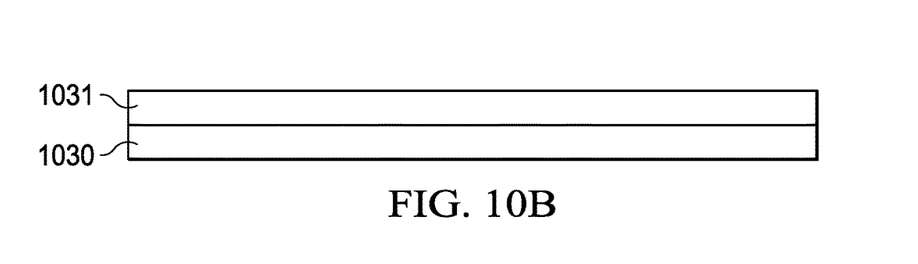
Figure 10C:
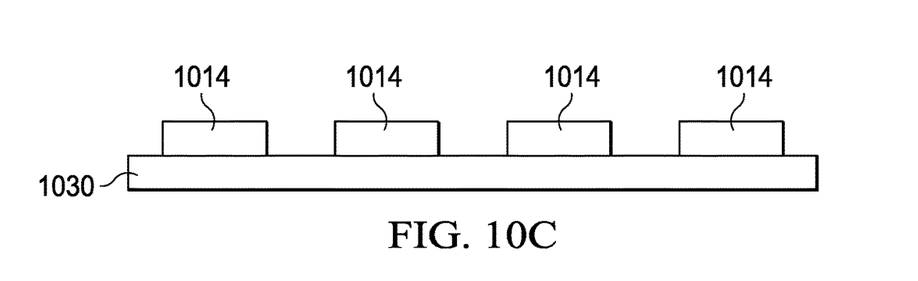

FIGS. 10A-10C illustrate in a series method steps for forming semiconductor device dies with RLEM elements attached in a wafer level process (WLP). In FIG. 10A, wafer 1030 and a wafer of RLEM material 1031 are bonded using wafer bonding processes, such as anodic bonding. At FIG. 10B, a cross section illustrates the wafer 1030 with the RLEM 1031 bonded to it. In FIG. 10C, the RLEM material is patterned, for example using a mechanical saw or scribe tool, or by using a pattern and etch process, to provide individual RLEM elements 1008 on the wafer. The processing can now proceed in the same manner as the wafer shown in FIG. 9A; the semiconductor device dies can be singulated from the wafer and the semiconductor device dies carrying the RLEM on the active surface can be placed on a package substrate strip and wire bonded as described hereinabove, and then covered with mold compound as also described hereinabove.

Modifications possible in the described arrangements, and other alternative arrangements are possible within the scope of the claims.

What is claimed is:

1. An apparatus, comprising:
a semiconductor device die with an active surface;
the semiconductor device die mounted on a package substrate with substrate leads and the semiconductor device die electrically coupled to the substrate leads;
at least a first rigid low expansion material (RLEM) covering a portion of the semiconductor device die; and
the first RLEM, the semiconductor device die, and a portion of the substrate leads covered with a mold compound and forming a packaged semiconductor device die; and p1 a second RLEM with a first side over a non-device side of the semiconductor device die, wherein the first RLEM and the second RLEM are of a same material, and wherein the first RLEM and the second RLEM physically contact the semiconductor device die without any intervening layers.

2. The apparatus of claim 1, further comprising:
a stress sensitive component on a device side of the semiconductor device die; and
the first RLEM covering the stress sensitive component.

3. The apparatus of claim 1, wherein the first RLEM covers a portion of a non-device side of the semiconductor device die.

4. The apparatus of claim 2, wherein the stress sensitive component on the semiconductor device die is selected from a group consisting essentially of: a bipolar junction transistor (BJT), an analog transistor, an oscillator, a bulk acoustic wave (BAW) oscillator, a piezoelectric device, a junction field effect transistor (JFET), a metal oxide semiconductor field effect transistor (MOSFET), a thin film resistor, and a vertical capacitor.

5. The apparatus of claim 1, further comprising
at least one stress sensitive component on the semiconductor device die;
the at least one stress sensitive component covered by the first RLEM; and
edges of the first RLEM overlapping the at least one stress sensitive component by at least 10 μm.

6. The apparatus of claim 1, wherein a coefficient of thermal expansion of the first RLEM and the second RLEM is between about positive 2 ppm/° C. and negative 30 ppm/° C.

7. The apparatus of claim 1, wherein a coefficient of thermal expansion of the first RLEM and the second RLEM is less than 2.6 ppm/° C.

8. The apparatus of claim 1, wherein the first RLEM and the second RLEM are one selected from a group consisting essentially of: sitall, invar, quartz, diamond, graphite, Corning ULE 7972, and Corning ULE 7973.

9. The apparatus of claim 1, wherein wire bonds electrically couple the semiconductor device die to the substrate leads.

10. The apparatus of claim 1, wherein a conductive post connects electrically couple the semiconductor device die to the substrate leads.

11. The apparatus of claim 1, wherein solder ball bonds couple the semiconductor device die to the package substrate.

12. The apparatus of claim 1, wherein the package substrate is a lead frame.

13. A packaged semiconductor device, comprising:
  a semiconductor device die with a device side and a non device side, the semiconductor device die mounted on a package substrate with substrate leads and the semiconductor device die electrically coupled to the substrate leads;
  a first material including ceramic covering a stress sensitive component in a portion of the active surface of the semiconductor device die;
  a second material including ceramic covering a non device side of the semiconductor device die; and
  the first material, the second material, the semiconductor device die, and a portion of the substrate leads covered with a mold compound, wherein the first material and the second material are of a same material, and wherein the first material and the second material physically contact the semiconductor device die without any intervening layers.

14. The packaged semiconductor device of claim 13, wherein the semiconductor device die is selected from a group consisting essentially of: a bipolar junction transistor (BJT), an analog transistor, an oscillator, a bulk acoustic wave (BAW) oscillator, a piezoelectric device, a junction field effect transistor (JFET), a metal oxide semiconductor field effect transistor (MOSFET), a thin film resistor, and a vertical capacitor.

15. The packaged semiconductor device of claim 13, wherein a coefficient of thermal expansion of the first material and the second material is between about positive 2 ppm/° C. and negative 30 ppm/° C.

16. The packaged semiconductor device of claim 13, wherein a coefficient of thermal expansion of the first material and the second material is less than 2.6 ppm/° C.

17. The packaged semiconductor device of claim 13, wherein wire bonds electrically couple the semiconductor device die to the substrate leads.

18. The packaged semiconductor device of claim 13, wherein the package substrate is a lead frame.

* * * * *